(12) United States Patent
Ayabe et al.

(10) Patent No.: US 9,975,321 B2
(45) Date of Patent: May 22, 2018

(54) FILM PEELING DEVICE

(71) Applicant: HITACHI PLANT MECHANICS CO., LTD., Kudamatsu-shi, Yamaguchi (JP)

(72) Inventors: Toshiaki Ayabe, Kudamatsu (JP); Kazuo Takahashi, Kudamatsu (JP); Shigenori Takesue, Kudamatsu (JP)

(73) Assignee: HITACHI PLANT MECHANICS CO., LTD., Kudamatsu-shi (JP)

( * ) Notice: Subject to any disclaimer, the term of this patent is extended or adjusted under 35 U.S.C. 154(b) by 0 days. days.

(21) Appl. No.: 15/467,133

(22) Filed: Mar. 23, 2017

(65) Prior Publication Data
US 2017/0326865 A1 Nov. 16, 2017

(30) Foreign Application Priority Data
May 10, 2016 (JP) ................. 2016-094416

(51) Int. Cl.
*B32B 38/10* (2006.01)
*B32B 43/00* (2006.01)
(Continued)

(52) U.S. Cl.
CPC ............ *B32B 43/006* (2013.01); *B32B 38/10* (2013.01); *H01L 21/67132* (2013.01);
(Continued)

(58) Field of Classification Search
CPC . B32B 38/10; B32B 43/006; Y10T 156/1168; Y10T 156/1174; Y10T 156/195; Y10T 156/1956; Y10T 156/1978
(Continued)

(56) References Cited

U.S. PATENT DOCUMENTS 4,867,836 A * 9/1989 Hamamura ......... B29C 63/0013
156/750
4,897,148 A * 1/1990 Orlandi .................. H05K 3/288
156/510
(Continued)

FOREIGN PATENT DOCUMENTS

JP 4231018 B2 2/2009
JP 4779132 B2 9/2011
WO WO 2014134878 A1 * 9/2014 ............. B32B 38/10

*Primary Examiner* — Mark A Osele
*Assistant Examiner* — Nickolas Harm
(74) *Attorney, Agent, or Firm* — Oliff PLC

(57) ABSTRACT

A film peeling device preventing deformation or other defect of substrates occurring in the process of conveying films adhered up to the substrate leading ends while peeling from the substrate, protecting the substrate from damage, and avoiding deterioration of the substrate quality. The constitution is composed of a substrate holding mechanism for holding the leading end of a substrate by linear contact, an adhering and peeling mechanism for peeling films by an adhesive force from the substrate held by the substrate holding mechanism, a film holding tool for gripping individually the leading ends of the films adhered to the substrate both sides being wound and lifted by the adhering and peeling mechanism, a film conveying unit drive mechanism for conveying the film holding tool gripping the films in the substrate opposite direction conveying direction, and a recovery container accommodating the films being gripped and conveyed by the film holding tool.

3 Claims, 5 Drawing Sheets

(51) Int. Cl.
*H01L 21/67* (2006.01)
*H01L 21/683* (2006.01)

(52) U.S. Cl.
CPC .. *H01L 21/6836* (2013.01); *H01L 2221/6834* (2013.01); *Y10T 156/1168* (2015.01); *Y10T 156/1174* (2015.01); *Y10T 156/195* (2015.01); *Y10T 156/1956* (2015.01); *Y10T 156/1978* (2015.01)

(58) Field of Classification Search
USPC .................. 156/714, 715, 759, 760, 764
See application file for complete search history.

(56) References Cited

U.S. PATENT DOCUMENTS

| | | | | |
|---|---|---|---|---|
| 5,540,809 | A * | 7/1996 | Ida | B29C 63/0013 156/715 |
| 9,108,397 | B2 * | 8/2015 | Kim | B32B 43/006 |
| 9,315,006 | B2 * | 4/2016 | Lee | B32B 38/10 |
| 9,623,647 | B2 * | 4/2017 | Yan | B32B 38/10 |
| 2008/0011420 | A1 * | 1/2008 | Yoshizawa | B65H 41/00 156/715 |
| 2013/0048223 | A1 * | 2/2013 | Ahn | B32B 38/10 156/718 |
| 2013/0133839 | A1 * | 5/2013 | Seo | B32B 43/006 156/715 |
| 2014/0008022 | A1 * | 1/2014 | Ahn | B29C 69/006 156/378 |

* cited by examiner

[Fig. 1]
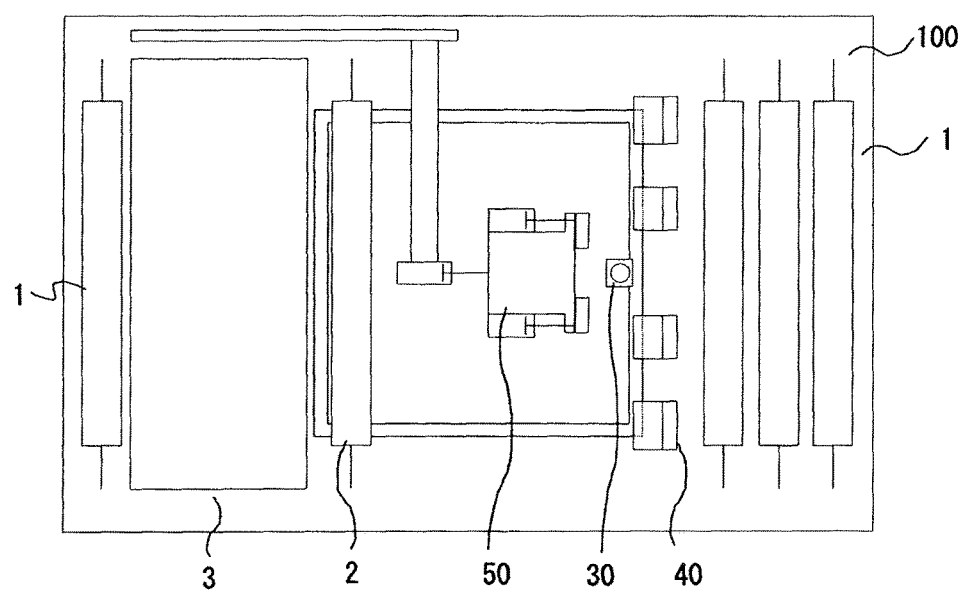

[Fig. 2]
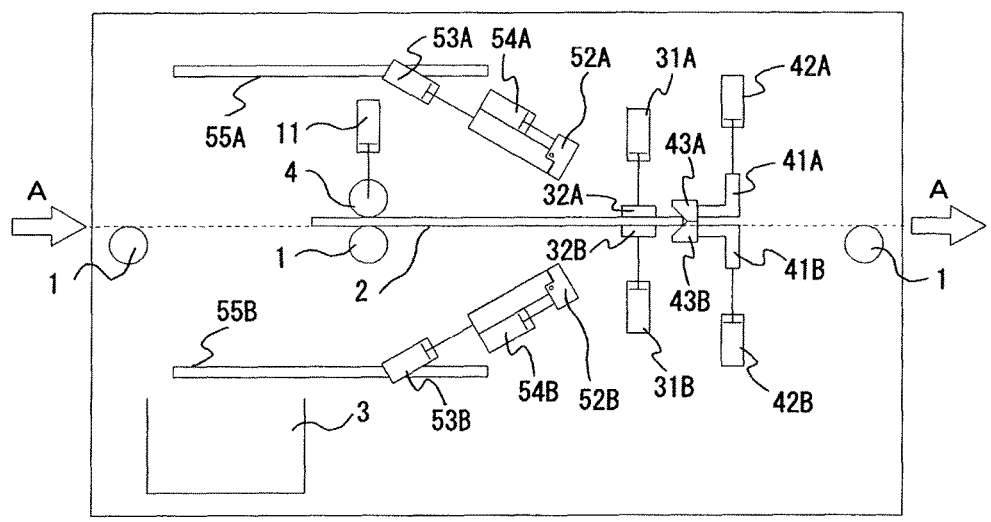

[Fig. 3]
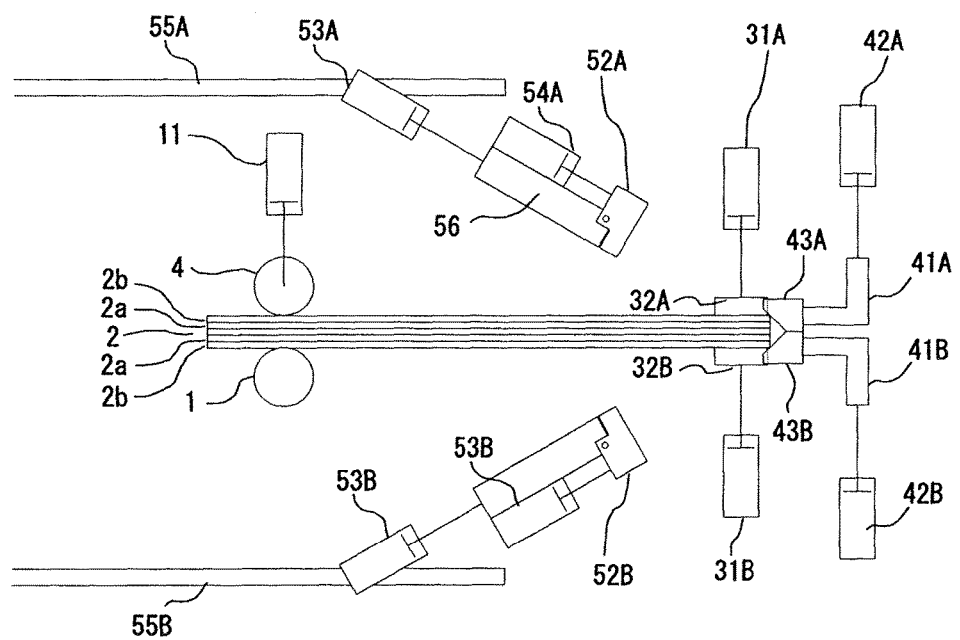

[Fig. 4]
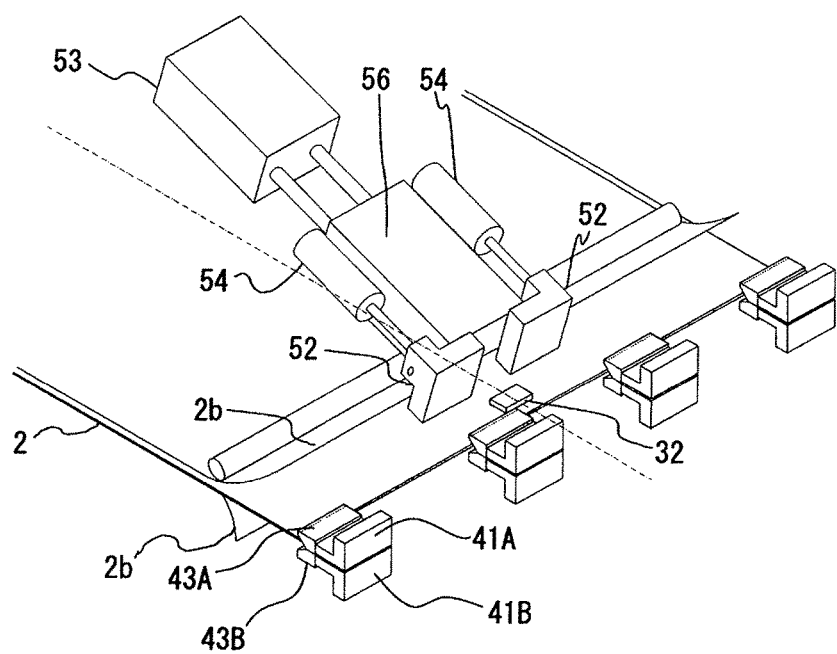

[Fig. 5]
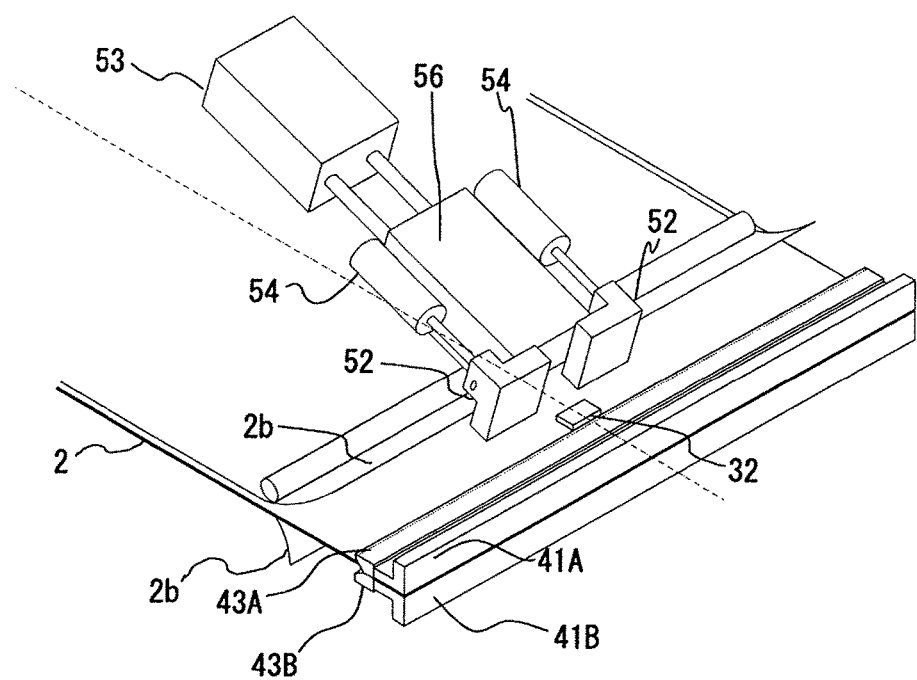

FILM PEELING DEVICE

TECHNICAL FIELD

The present invention relates to a film peeling device for peeling a film adhered to a substrate.

BACKGROUND ART

Conventionally, as means for peeling a film adhered to a substrate, patent document 1 discloses a method of peeling a peeling adhesive tape pressed on the surface of a substrate on which a film is adhered, in a state of pinching the substrate by pressing rollers, by moving the substrate on a conveying route to the downstream side, and rolling up the film and moving this portion in a conveying direction of a film gripping and conveying mechanism for holding this portion by a clamping unit.

Alternatively, as disclosed in patent document 2, there is also a method of holding the leading end of a substrate, winding up a peeling adhesive tape in a pressed state on a conveying route to the downstream side, and moving in a conveying direction by using a film gripping and conveying mechanism for gripping the lifted film by a clamping unit.

PRIOR ART LITERATURE

Patent Literature

Patent Documents

[Patent Document 1]
Japanese Patent Laid-Open Publication No. 4779132
[Patent Document 2]
Japanese Patent Laid-Open Publication No. 4231018

SUMMARY OF THE INVENTION

Problems to be Solved by the Invention

Incidentally, according to the methods disclosed in patent documents 1 and 2, it is required to clamp the leading end of the substrate when peeling the films adhered on both sides of the substrate from the substrate.

For this purpose, to peel the film adhered to the substrate, it is necessary to provide a substrate clamping allowance by determining the film adhering position by clearing a space from the substrate end, which made it impossible to peel the film adhered to the leading end of the substrate.

Otherwise, if attempted to peel without clamping the leading end of the substrate, the substrate may be folded up and down and be broken.

In the light of the problems of the conventional film peeling device, it is a prior object of the invention to present a film peeling device capable of preventing deformation or other defects of the substrate taking place in the process of peeling and conveying the film adhered to the leading end of the substrate from the substrate, without damaging the substrate and without deteriorating the quality of the substrate.

Means for Solving the Problems

To achieve the object, the film peeling device of the invention is a film peeling device having substrate conveying means for conveying a substrate, for peeling the films adhered to both sides of the substrate being conveyed by the substrate conveying means, comprising a substrate holding mechanism for holding the leading end of the substrate by linear contact, an adhering and peeling mechanism for peeling the film by an adhesive force from the substrate held by the substrate holding mechanism, a film holding tool for individually gripping the leading ends of the films adhered to both sides of the substrate wound and lifted by the adhering and peeling mechanism, a film conveying unit drive mechanism for conveying the film holding tool holding the films in an opposite direction of the substrate conveying direction, and a recovery container for holding the films being held and conveyed by the film holding tool.

In this case, the substrate holding mechanism may be disposed on a portion contacting with the leading end of the substrate at an inclined angle.

Effects of the Invention

The film peeling device of the invention comprises a substrate holding mechanism for holding a leading end of a substrate by linear contact, an adhering and peeling mechanism for peeling the film held by the adhering and peeling mechanism by an adhesive force, a film holding tool for individually gripping the leading ends of the films adhered to both sides of the substrate wound and lifted by the adhering and peeling mechanism, a film conveying unit drive mechanism for conveying the film holding tool holding the films in an opposite direction of the substrate conveying direction, and a recovery container for accommodating the films being held and conveyed by the film holding tool, whereby it provides lots of advantages being capable of preventing oscillation and deformation of the substrate occurring in the process of peeling the film or clamping the substrate, peeling without limiting the adhering position of the film, preventing deformation of the substrate taking place in the steps of peeling the film adhered to the leading end of the substrate from the substrate and conveying, and preventing deterioration of the quality of the substrate without damaging the substrate.

Still more, the substrate holding mechanism has an inclination angle in an area contacting with the leading end of the substrate, so that the leading end of the substrate can be held securely by linear contact.

BRIEF DESCRIPTION OF THE DRAWINGS

FIG. 1 is a plan view showing an outline structure of a film peeling device of the invention.

FIG. 2 is a front view showing an outline structure of an embodiment of the film peeling device.

FIG. 3 is a magnified front view showing a structure of a substrate holding mechanism and a peeling unit in the embodiment shown in FIG. 2.

FIG. 4 is a partial perspective view showing a structure of the substrate holding mechanism and the peeling unit in the embodiment shown in FIG. 2.

FIG. 5 is a partial perspective view showing an embodiment of the substrate holding mechanism in the embodiment shown in FIG. 2.

BEST MODE FOR CARRYING OUT THE INVENTION

An embodiment of the film peeling device of the invention is described below by reference to FIG. 1 to FIG. 4.

Herein, FIG. 1 is a plan view showing an outline structure of the film peeling device, FIG. 2 is a front view showing an outline structure of the film peeling device, FIG. 3 is a magnified front view showing an outline structure of a substrate holding mechanism and a film holding mechanism in the embodiment shown in FIG. 2, and FIG. 4 is a partial perspective view showing a structure of the substrate holding mechanism and the film holding mechanism in the embodiment shown in FIG. 2.

In the following explanation of the embodiment, those located at the upper side of the substrate 2 are provided with subscript A, others located at the lower side of the substrate 2 are provided with subscript B, and common parts are not provided with subscript. For example, a clamp tool located at the upper side of the substrate 2 is called 41A, a clamp tool located at the lower side is 41B, and a clamp tool is commonly called 41.

As shown in FIG. 1, a film peeling device 100 is composed of, among others, a substrate conveying roller 1, an adhering and peeling mechanism 30 for peeling a film end portion by an adhesive force, a substrate holding mechanism 40 for holding a substrate front end portion, a film peeling and conveying mechanism 50 for gripping and conveying the end portion of the film peeled from a substrate 2 by the adhering and peeling mechanism 30, and a recovery container 3 of a film 2b.

The substrate conveying roller 1 is arranged in a plurality horizontally in order to convey the substrate 2, and a conveying path of the substrate 2 is formed.

The substrate 2 is conveyed, as indicated by arrow A in FIG. 2, from the left side (inlet) to the right side (outlet) of the film peeling device 100.

On the upside and the downside of the substrate 1, a resist film 2a is adhered as shown in FIG. 3, and a film 2b is laminated and adhered further on the resist film 2a.

The resist film 2a is adhered to the surface of the substrate 2 by heat treatment, and the film 2b is glued to the resist film 2a by the own adhesiveness of the resist film 2a.

The film 2b is for protecting the resist film 2a adhered to the surface when the substrate 2a is treated in the substrate manufacturing process.

As described above, in the midst of the conveying path of the substrate 2 composed of a plurality of substrate conveying rollers 1, there are provided the adhering and peeling mechanism 30, the substrate holding mechanism 40, and the film peeling and conveying mechanism 50, and the substrate holding mechanism 40 is disposed near the substrate end portion of the film front end portion of the substrate 2 at both sides of the conveying side end faces of the conveyed substrate 2.

The adhering and peeling mechanism 30 of films of substrates is disposed in the center near the front end in the width direction of the film 2b, and is provided at two positions in total including the upper and lower portions.

The substrate holding mechanism 40 has L-shaped clamp tool 41A of substrate upside and L-shaped clamp tool 41B of substrate downside, coupled respectively to respective cylinders 42A, 42B, in order to move in the vertical direction to the substrate 2, so as to hold the vicinity of the leading end of the substrate 2 (front end of the film 2b).

The clamp tool 41A and clamp tool 41B are respectively provided with blocks 43A and 43B in order to sustain the substrate 2.

These blocks 43A, 43B are provided with slopes at an inclination angle in the substrate end face contacting part, specifically a downward slope in the block 43A, and an upward slope in the block 43B, so as to be capable of retaining the upper and lower end edges of the substrate 2 in linear contact, without clamping the substrate 2, so that the substrate 2 may not oscillate up and down at the time of initial peeling off.

The film peeling and conveying mechanism 50 is provided at two positions in total including the upper and lower portions, near the adhering and peeling mechanism 30 as shown in FIG. 1 and FIG. 2.

This film peeling and conveying mechanism 50 is composed of a film holding tool 52 for holding the end portion of the film 2b, a cylinder 54 for extending the film holding tool 52, support members 56 having the cylinder 54 provided at right and left sides, a cylinder 53 for extending the support members 56, and a film conveying unit drive mechanism 55 for moving the cylinder 53.

The film 2b conveyed by the film peeling and conveying mechanism 50 is sent into the recovery container 3 of the film 2b provided at the inlet side of the film peeling device 100.

Below is described the operation of thus constituted film peeling device 100.

The substrate 2 is conveyed in the direction of arrow A in FIG. 2 from the entry of the film peeling device 100 toward the outlet of the film peeling device 100 by means of the substrate conveying rollers 1.

The substrate 2 is conveyed on the conveying path by means of the substrate conveying rollers 1, and is sensed by an optical sensor not shown in the drawing, and the pressing roller 4 is lowered by the action of the cylinder 11, and the substrate 2 is gripped and conveyed together with the substrate conveying rollers 1.

When the substrate 2 is conveyed on the conveying path by means of the substrate conveying rollers 1, and reaches up to a specified position of the adhering and peeling mechanism 30, it is sensed by an optical sensor not shown in the drawing.

When the sensor senses the substrate 2, the cylinders 42A, 42B are put in action, and the clap tools 41A, 41B are moved to the substrate side, and the substrate 2 is confined by the blocks 43A, 43B.

The blocks 43A, 43B are disposed on slopes at an inclination angle to the substrate end face contact portion, specifically, the block 43A has a downward slope and the block 43B has an upward slope, and the substrate 2 is not clamped, but is retained by linear contact at upper and lower end edges of the end face of the substrate 2, so that the substrate 2 may not oscillate up and down at the time of initial peeling off.

When the substrate 2 is retained, as shown in FIG. 3, flat pushing plates 32A, 32B having peeling adhesive tapes are pressed to the substrate by the action of the cylinders 31A, 31B near the substrate end portion of the front end portion of the film 2b of the substrate 2 held by the substrate holding mechanism 40.

Afterwards, when the flat pushing plates 32A, 32B having peeling adhesive tapes are returned to the original position, the leading end portion of the film 2b is initially peeled from the substrate 2, and the leading end of the peeled film 2b is gripped by a film retainer 52.

After the film 2b is gripped by the film retainer 52, the film 2b is being peeled from the substrate 2 by the film peeling and conveying mechanism 50, and is conveyed in the substrate conveying direction A.

The film 2b peeled by the film peeling and conveying mechanism 50 is conveyed in an opposite direction of the substrate conveying direction A, that is, to the substrate conveying inlet side of the film peeling mechanism 100, and is accommodated in the recovery container 3.

The substrate 2 after the film 2b is peeled is conveyed by the substrate conveying rollers 1 into an apparatus for cleaning process installed in a later stage of the film peeling device.

As described herein, in this embodiment, when peeling the film 2b adhered on the resist film 2a laminated on the substrate 2, with the substrate 2 confined by the substrate conveying rollers 1 and the pressing rollers 4, the front end of the substrate 2 is held in linear contact without clamping the leading end portion of the substrate 2 by the block 43 of the substrate holding mechanism 40, so that the film 2b adhered to the front end of the substrate 2 can be peeled while preventing deformation possibly occurring at the time of peeling.

FIG. 5 is a partial perspective view showing an embodiment of the substrate holding mechanism in the embodiment shown in FIG. 2, showing another example of the substrate holding mechanism.

In FIG. 5, what differs from FIG. 4 is as follows.

FIG. 4 shows four clamp tools 41, and FIG. 5 shows the clamp tool 41 and the block 43 disposed on the overall width of the substrate 2.

This configuration enables to adjust the holding force on the substrate 2, and to hold more uniformly as compared with the case of FIG. 4.

The invention is not limited to these embodiments, but may be carried out, for example, as follows.

(1) The block 43 of the substrate holding mechanism 40 may be disposed either in a singularity or in a plurality.

(2) When the film adhered to the substrate is spaced from the leading end of the substrate, the leading end of the substrate may be gripped by the flat portion of the block 43 of the substrate holding mechanism 40.

(3) The driving cylinder 42 of the substrate holding mechanism 40 may be disposed either in a singularity or in a plurality.

(4) The drive source of the driving cylinder 42 of the substrate holding mechanism 40 may be either pneumatic drive or electric drive.

(5) The substrate may be glass, ceramic, resin, semiconductor, or laminated plate.

(6) The film adhered to the upside or the downside of the substrate may be peeled.

As described herein, the invention provides a film peeling device capable of holding the leading end of the substrate without clamping it, peeling the film adhered to the end face of the substrate without damaging the substrate, and peeling the film without deteriorating the quality.

The film peeling device of the invention is herein described by reference to its embodiments, but it must be noted that the invention is not limited to these illustrated embodiments alone, but may be changed and modified in various forms within a scope not departing from the true spirit thereof.

INDUSTRIAL APPLICABILITY

The film peeling device of the invention is capable of preventing deformation of substrate or other defects occurring in the process of conveying while peeling the film adhered to the leading end of the substrate from the substrate, and avoiding deterioration of the quality of the substrate without damaging the substrate, and is hence applicable widely in the film peeling device for peeling the film adhered to the leading end of the substrate from the substrate.

DESCRIPTION OF THE REFERENCE NUMERALS 1 substrate conveying roller
2 substrate
2a resist film
2b film
3 recovery container
4 pressing roller
11 cylinder
30 adhering and peeling mechanism
31 cylinder
32 flat pressing plate
40 substrate holding mechanism
41 clamp tool
42 cylinder
43 block
50 film peeling and conveying mechanism
52 film holding tool
53 cylinder
54 cylinder
55 film conveying unit drive mechanism
100 film peeling device

The invention claimed is:

1. A film peeling device, being a film peeling device having substrate conveyer for conveying substrates, for peeling films adhered to both sides of the substrate being conveyed by the substrate conveying means, the film peeling device comprising:
    a substrate holder for holding the leading end of the substrate by linear contact at edges of the leading end;
    a peeler for peeling the films by an adhesive force from the substrate held by the substrate holder;
    a film holder for gripping individually the leading ends of the films adhered to both sides of the substrate being wound and lifted by the peeler;
    a film conveying unit driver for conveying the film holder gripping the films in an opposite direction of the substrate conveying direction; and
    a recovery container for accommodating the films being gripped and conveyed by the film holder.

2. The film peeling device as set forth in claim 1, wherein the substrate holder includes a block with a portion provided at an inclination angle to contact one of the edges of the leading end of the substrate.

3. The film peeling device as set forth in claim 1, wherein the substrate holder comprises:
    a first clamp provided with a first block; and
    a second clamp provided with a second block positioned adjacent the first block, wherein
    the first block and the second block are provided with opposing inclined faces to contact the edges of the leading edge, the opposing inclined faces sloping away from each other in a first direction opposite a second direction that the substrate conveyer is configured to convey the substrate.

* * * * *